United States Patent [19]
Takahashi

[11] Patent Number: 5,957,305
[45] Date of Patent: Sep. 28, 1999

[54] LINEARLY MOVING MECHANISM

[75] Inventor: Hiroyuki Takahashi, Gyoda, Japan

[73] Assignee: Advantest Corporation, Tokyo, Japan

[21] Appl. No.: 09/085,558

[22] Filed: May 27, 1998

[30] Foreign Application Priority Data

May 28, 1997 [JP] Japan ..................................... 9-138766

[51] Int. Cl.[6] .................................................. B07C 5/344
[52] U.S. Cl. ..................................... 209/573; 414/226.01
[58] Field of Search .................................... 209/573, 574,
209/571; 414/222.01, 222.1, 222.13, 223.01,
225.01, 226.01, 226.05

[56] References Cited

U.S. PATENT DOCUMENTS

| | | | |
|---|---|---|---|
| 5,596,270 | 1/1997 | Mitsui | 414/226.01 X |
| 5,612,068 | 3/1997 | Kempf et al. | 414/223.01 X |
| 5,865,319 | 2/1999 | Okuda et al. | 209/573 X |
| 5,870,820 | 2/1999 | Arakawa et al. | 414/226.01 X |

*Primary Examiner*—David H. Bollinger
*Attorney, Agent, or Firm*—Gallagher & Lathrop; David N. Lathrop

[57] ABSTRACT

A linearly moving mechanism is provided which allows for shortening the length of linear guide rails mounted to a fixed part and a movable part, respectively. A first linear guide rail 31A is mounted to the side surface of the fixed part opposing the movable part while a second linear guide rail 31B is mounted to the side surface of the movable part opposing the fixed part so as to be in opposing relation to the first linear guide rail. First and second movable members 33A and 33B are slidably engaged with the first and second linear guide rails, respectively. A movable member support 34 supports the first and second movable members thereon toward one end of one of the first and second linear guide rails and toward the other end of the other of the rails, respectively, in the state that the first and second linear guide rails are in opposing relation to each other. Tension coil springs 19A and 19B impart a biasing force to the movable part and the movable member support, respectively, so as to hold the first and second linear guide rails in opposing relation to each other.

17 Claims, 7 Drawing Sheets

LINEARLY MOVING MECHANISM

BACKGROUND OF THE INVENTION

1. Field of the Invention

The present invention relates to a linearly moving mechanism for reciprocally moving articles along a straight line, and particularly to a linearly moving mechanism suitable for use in, for example, a semiconductor device transporting and handling (processing) apparatus (commonly called handler) for transporting semiconductor devices such as semiconductor integrated circuit elements for testing purposes and sorting out the tested semiconductor devices on the basis of the test results.

2. Description of the Related Art

First, a semiconductor device transporting and handling apparatus (which will be referred to as handler hereinafter) which is typical of the apparatus utilizing the linearly moving mechanism of the type concerned will be described. FIG. 4 illustrates the general construction of one example of the conventional IC handler called "horizontal transporting system". This handler is designed to be used in conjunction with a semiconductor device testing apparatus for testing semiconductor devices, particularly an IC testing apparatus (commonly called IC tester) for testing semiconductor integrated circuit elements (which will be referred to as IC hereinafter) typical of semiconductor devices, so that articles moved by the linearly moving mechanism are ICs. It is to be understood, however, that the linearly moving mechanism of the type disclosed herein may also be used with any apparatus for linearly moving articles other than ICs.

The illustrated handler includes a plurality of tray groups 2A–2E arranged along the lower side as viewed in the drawing of the platform 1 constituting a base. Each of the tray groups 2A–2E comprises a plurality of trays stacked vertically one on another (the tray group 2E contains only one tray in the illustrated example). The leftmost tray group 2A in the drawing is located in the loader section. Each of the trays of the tray group 2A in the loader section is loaded with a plurality of ICs to be tested (ICs under test).

X-Y carrier arms 3A, 3B pick up two, in this example, ICs under test at a time from the uppermost tray of the tray group 2A positioned at the loader section, and transport them onto a rotary IC transport 4 (which is also termed turntable) called "soak stage". Two, in this example, rows of positioning recesses 5 for defining the positions for receiving the ICs are formed in the IC transport 4 at equal angular intervals on concentric circles. Each positioning recess 5 is of substantially square shape and is surrounded on four sides by upwardly inclined walls. Each time the IC transport 4 rotates by one pitch, the X-Y carrier arms 3A, 3B drops two ICs down into corresponding ones of the two concentric rows of positioning recesses 5. More specifically, attached to the Y carrier arm, in this example, of the X-Y carrier arms 3A, 3B is a transport head 3C which is adapted to pick up two ICs under test from the uppermost tray of the tray group 2A at the loader section and transport the thus grasped ICs onto the IC transport 4 by virtue of the movements in the X-Y directions of the X-Y carrier arms 3A, 3B.

The ICs conveyed by the IC transport 4 are delivered into the test section 7 by a rotary type transfer arm 6 referred to as contact arm. Specifically, the contact arm 6 is adapted to pick up two ICs, one from each of the positioning recesses 5 in the IC transport 4 and transport them to the test section 7. The contact arm 6 has three arms each provided with a transport head, and performs the operations, by rotation of the three arms, of successively delivering the ICs under test to the test section 7 and of successively transferring the ICs tested in the test section 7 to a rotary type transfer arm 8 on the exit side.

It should be noted that the IC transport 4, the contact arm 6 and the test section 7 are contained in a constant temperature chamber 9 (usually referred to as chamber) so that ICs may undergo the testing within the chamber 9 while being maintained at a predetermined temperature. In this regard, the arrangement is such that the temperature in the interior of the constant temperature chamber 9 may be controlled to either a designed high temperature (such as 125° C.) or low temperature (such as −55° C.) so that the ICs to be tested may be applied with a predetermined temperature stress. It should be noted that the rotary transfer arm 8 on the exit side is so configured that one of its arms is normally positioned in the interior of the constant temperature chamber 9.

The rotary transfer arm 8 on the exit side has also three arms each provided with a transport head, and delivers, by rotation of the three arms, the tested ICs grasped by the transport heads out to the unloader section. The tested ICs taken out of the constant temperature chamber 9 are sorted out on the basis of the test results and stored in corresponding one of the three, in this example, tray groups 2C, 2D and 2E located in the unloader section. By way of example, non-conforming or defective (failure) ICs are stored in a tray of the rightmost tray group 2E, conforming or defectless (pass) ICs are stored in a tray of the tray group 2D to the left of the group 2E, and ICs requiring re-testing are stored in a tray of the tray group 2C further to the left of the group 2E. This sorting is controlled on the basis of the data of the test results and operated by the X-Y carrier arms 10A, 10B. The Y carrier arm 10A, in this example, is equipped with a transport head 10C which is adapted to pick up ICs tested and sorted out and deliver to an appropriate tray.

It is to be noted that the trays of the second leftmost tray group 2B as viewed in the drawing are empty ones located at the empty tray buffer stage for accommodating trays emptied of ICs in the loader section. When the uppermost one of the stacked trays of any of the tray groups 2C, 2D and 2E is filled with ICs, a tray of the empty tray group 2B is conveyed to the top of the filled tray to be used to store ICs therein.

The contact arm 6 mentioned above will be described in more details with reference to FIGS. 5 and 6. The contact arm 6 includes a rotary shaft 6A (see FIG. 6) rotatably mounted in the thermally insulating top wall 11 of the constant temperature chamber 9 and having an arm supporting block 6B secured to the lower end thereof. Three arms 18 (only one of which is visible in FIG. 5) extend generally horizontally and radially from the arm supporting block 6B at angular intervals of about 120°. Each of the arms 18 is an L-shaped member having a generally horizontally extending main arm portion 18A and a vertical leg portion 18B depending at a substantially right angle from the main arm portion 18A and the three arms 18 are caused to rotate by rotation of the rotary shaft 6A.

Each arm 18 has a linear guide rail 31 extending vertically along the length of and attached to the outer wall of the depending leg portion 18B, and a pair of movable members 32 are engaged with the linear guide rail 31 for sliding movement vertically therealong. The movable members 32 are secured to the vertical wall of a head supporting member 14 adjacent its upper end which comprises a plate-like member having opposite ends bent at generally right angles and reinforced with a reinforcement member 14A. Mounted to the lower end or free end of the head supporting member 14 is a transport head 13 for grasping and angularly transporting ICs. It will thus be appreciated that the head supporting member 14 and the transport head 13 are mounted by means of the movable members 32 and the linear guide rail 31 for vertical motions relative to the depending leg portion 18B of the associated arm 18. The transport head 13 is provided with two, in this example, vacuum pick-up heads adapted to vacuum attract and grasp ICs for angular conveyance.

In addition, a tension coil spring 19 extends vertically and are connected at opposite ends with an arm member 15 affixed to each IC supporting member 14 adjacent its lower end and an arm member 20 affixed to the depending leg portion 18B of the associated arm 18 adjacent its upper end so that each IC supporting member 14 is normally upwardly biased by the tension of the tension coil spring 19 to be kept stationary at a predetermined position (shown in FIG. 6) along the outer wall of the depending leg portion 18B of the associated arm 18.

The rotary IC transport (soak stage) 4 includes a rotary shaft (not shown) rotatably mounted in the thermally insulating bottom wall 12 of the constant temperature chamber 9 and is spaced a predetermined distance above the bottom wall 12. The rotary IC transport 4 is constructed of a hub portion and a peripheral portion interconnected by six spokes in this example. ICs to be tested are placed for transportation in two, in this example, concentric rows of positioning recesses 5 formed in the peripheral portion.

In the conventional handler illustrated in FIGS. 4–6, since the test section 7 is located vertically below the rotary IC transport 4, a cam 24 in the form of a semi-annular ring in plan view having a generally inverted triangular peripheral surface (see FIG. 5) is mounted on the handler concentrically with the rotary shaft of the contact arm 6 such that the IC supporting member 14 is caused to descend to position the transport head 13 at an elevation of a predetermined distance above the test section as ICs are picked up and angularly moved by the transport head 13. It is to be appreciated by those skilled in the art, however, that this is only one example and that the present invention is not limited to the application to the configuration and construction of the handler as illustrated herein, since some linearly moving mechanism is required even if the test section 7 is in the same plane as the IC transport 4.

Although the cam 24 is fixed and will not itself move to drive a cam follower, it is called "cam" in this disclosure because it performs virtually the same function as the cam.

With the construction as described above, when one of the arms 18 of the contact arm 6 is rotated and comes to a standstill at a predetermined position over the IC transport 4 as shown in FIG. 6, the other two arms 18 come to a stop at a predetermined position over the test section 7 and at the point of transfer (buffer stage) to the rotary transfer arm 8 on the exit side, respectively. At these stop positions, push rods 21 are disposed at predetermined angular intervals in overlying and opposed relation to the associated IC supporting members 14, respectively. Each push rod 21 is vertically movably mounted in the top wall 11 of the constant temperature chamber 9 such that the push rod 21 may be lowered through a predetermined stroke by a drive means, not shown upon the three arms 18 of the contact arm 6 arriving at the predetermined positions over the IC transport 4, the test section 7, and the buffer stage, respectively.

The operation of one of the arms 18 which has stopped at a position over the IC transport 4 will now be described specifically with reference to FIG. 6. As the associated push rod 21 is lowered through a predetermined stroke by the drive source, the lower end 21A of the push rod 21 comes into abutment against the top of the IC supporting member 14 before pushing down on the IC supporting member 14 whereby the pair of movable members 32 attached to the IC supporting member 14 are moved downwardly slidingly along the linear guide rail 31 affixed to the depending leg portion 18B of the arm 18 against the tensioning force of the coil spring 19 while the IC supporting member 14 in unison with the transport head 13 is depressed. As the push rod 21 is lowered by a predetermined distance, the vacuum heads of the transport head 13 are lowered by a predetermined distance of travel (stroke) ST whereupon the vacuum heads of the transport head 13 come into contact with the ICs under test placed in the positioning recesses 5 of the IC transport 4. Otherwise stated, the downward stroke of the push rod 21 lowered by the drive means is defined so as to be equal to the distance through which the vacuum heads of the transport head 13 are moved from its predetermined stop position down to the position where they come into contact with the ICs under test placed in the positioning recesses 5 of the IC transport 4.

Upon the vacuum heads of the transport head 13 picking up and holding the ICs under test, the drive source is deactivated. As a result, the IC supporting member 14 is pulled upwardly by the tensioning force of the coil spring 19 with the pair of movable members 32 sliding upwardly along the linear guide rail 31 until the IC supporting member 14 arrives at its original stop position where it is stopped. It is thus to be understood that two ICs 16 under test vacuum attracted against the transport head 13 are moved from the positioning recesses 5 of the IC transport 4 up to the upper predetermined position.

With regard to the test section 7, as the associated push rod 21 is lowered through a predetermined stroke by the drive source, ICs under test attracted against the transport head 13 are caused by the same moving operation as described above to move from their predetermined stop position down to the position where they come into contact with the sockets, not shown in the test section 7. In this state, the ICs under test undergo the test. Upon the test being completed, the drive source for the push rod 21 is deactivated. As a result, the IC supporting member 14 is pulled upwardly by the tensioning force of the coil spring 19 until the IC supporting member 14 arrives at its original stop position where it is stopped. The two tested ICs remain vacuum attracted against the transport head 13.

Similarly, in the buffer stage where the ICs are transferred to the rotary transfer arm 8 on the exit side, as the associated push rod 21 is lowered through a predetermined stroke by the drive source, the tested ICs attracted against the transport head 13 are caused by the same moving operation as described above to move from their predetermined stop position down onto the buffer stage. In this state, the vacuum suction force of the transport head 13 is terminated to release the tested ICs from the transport head 13, followed by the drive source for the push rod 21 is deactivated. As a result, the IC supporting member 14 is pulled upwardly by the tensioning force of the coil spring 19 until the IC supporting member 14 arrives at its original stop position where it is stopped. No ICs are now present on the transport head 13 while the two tested ICs are placed on the buffer stage at a predetermined position.

It is thus to be appreciated that the rotary transfer arm 8 on the exit side may also use a linearly moving mechanism similar to that described above to transport tested ICs from the buffer stage to the unloader section.

As discussed above, since the prior art linearly moving mechanism comprises the linear guide rail 31 of the depending leg portion 18B of each arm 18 of the contact arm 6 and the pair of movable members 32 secured to the head supporting member 14, it is seen in FIG. 6 that the effective length L of the linear guide rail 31 actually required for allowing the movable members 32 to slide therealong is equal to the sum of the actually required stroke ST of the transport head 13 and at least the length P of the movable members 32 (L=ST+P).

In order to insure stable and reliable sliding motions of the movable members 32 as well as to allow for the adjustment of the stroke of the movable members 32, it is to be appreciated from FIG. 6 that the linear guide rail 31 actually extends upwardly and downwardly beyond the stop positions (the uppermost and lowermost positions) of the movable members 32. Consequently, the actual length of the linear guide rail 31 is often made about twice as long as the effective length L thereof.

Accordingly, it has heretofore been required that the distance or spacing between the top wall 11 and the bottom wall 12 of the constant temperature chamber 9 be made at least a little over twice as long as the effective length L of the linear guide rail 31, resulting in the sincere disadvantage that the oversized constant temperature chamber 9 leads necessarily to oversizing of the entire handler.

The aforesaid disadvantage is not limited to the handler as described above, but may be the case with any other handler called horizontal transporting system if the linearly moving mechanism of the type described above is used in the constant temperature chamber 9.

By way of example, the handler of the type illustrated in FIG. 7 is often employed which comprises a loader section 44 where ICs 42 to be tested which have been beforehand loaded on a customer tray (user tray) 41 by a user are transferred and reloaded onto a test tray 43 capable of withstanding high/low temperatures; a constant temperature chamber 47 including a soak chamber 45 for applying a predetermined temperature stress to the ICs 42 under test transported from the loader section 44 and a test section 46 for receiving and testing the ICs 42 under test to which a predetermined temperature stress has been applied; and an unloader section 49 where the tested ICs which have been carried on the test tray 43 from the test section 46 to an exit chamber 48 and which have been delivered out of the exit chamber 48 subsequently to being relieved of a temperature stress are transferred from the test tray 43 to the customer tray 41 to be reloaded on the latter (generally, the tested ICs are often sorted out by categories based on the data of the test results and transferred onto the corresponding customer trays.). The test tray 43 is moved in a circulating manner from and back to the loader section 44 sequentially through the constant temperature chamber 47 and the unloader section 49. In the test section 46, the ICs 42 under test are brought into electrical contact with IC sockets to be subjected to the test.

This type of handler may also require X-Y transport apparatus and linearly moving mechanism, if the handler is configured to pick up ICs under test from the test tray 43 and transfer them onto the IC sockets in the test section 46 to test them. It will thus be appreciated that as is the case with the handler illustrated in FIGS. 4–6, the handler described just above may also be attended with the sincere disadvantage that the actual length of the linear guide rail of the linearly moving mechanism is made a little over twice as long as the effective length thereof, requiring that the constant temperature chamber 47 and hence the entire handler be oversized.

Not only in the handler but also in any other apparatus in which it is required to use the linearly moving mechanism constructed as described above within a space (chamber) bounded by a top wall (ceiling) and a bottom wall (floor), the actual length of the linear guide rail of the linearly moving mechanism is made a little over twice as long as the effective length thereof, so that the spacing between the top wall and the bottom wall of the space accommodating the linearly moving mechanism is undesirably increased, resulting in oversizing the entire apparatus.

SUMMARY OF THE INVENTION

It is an object of the present invention to provide a linearly moving mechanism which allows for shortening the length of linear guide rails mounted to a fixed part and a movable part, respectively.

It is another object of the present invention to provide a semiconductor device transporting and handling apparatus (handler) equipped with a linearly moving mechanism which allows for reducing the spacing between the top wall and the bottom wall of the constant temperature chamber.

In order to accomplish the aforesaid objects, according to a first aspect of the present invention, a linearly moving mechanism is provided which includes a fixed part and a movable part having side surfaces opposing each other, the movable part being adapted to reciprocally move along a straight line relative to the fixed part, the linearly moving mechanism comprising a first linear guide rail mounted to the side surface of the fixed part opposing the movable part; a second linear guide rail mounted to the side surface of the movable part opposing the fixed part so as to be in opposing relation to the first linear guide rail; first and second movable member means slidably engaged with the first and the second linear guide rails, respectively; a movable member support supporting the first and the second movable member means thereon toward one end of one of the first and second linear guide rails and toward the other end of the other of the rails, respectively, in the state the first and second linear guide rails are in opposing relation to each other; and biasing means for imparting a biasing force to the movable part and a biasing force to the movable member support, respectively, so as to hold the first and second linear guide rails in opposing relation to each other.

In a preferred embodiment, the aforesaid first and second linear guide rails are of approximately equal length, the biasing means for imparting a biasing force to the movable part and the biasing means for imparting a biasing force to the movable member support having biasing forces determined such that movement of the movable part by a predetermined distance will cause the movable member support to move by approximately ½ of the distance of movement of the movable part.

The biasing means for imparting a biasing force to the movable part and the biasing means for imparting a biasing force to the movable member support may each be a tension coil spring, the tensioning forces of the tension coil springs being determined such that when the movable part is moved by a predetermined distance, those tension coil springs are extended by an approximately equal length with each other.

According to a second aspect of the present invention, the foregoing objects are accomplished by providing a linearly moving mechanism including a fixed part and a movable part having side surfaces opposing each other, the movable part being adapted to reciprocally move along a straight line relative to the fixed part, the linearly moving mechanism comprising: a first linear guide rail mounted to the side surface of the fixed part opposing the movable part; a second linear guide rail mounted to the side surface of the movable part opposing the fixed part so as to be in opposing relation to the first linear guide rail; a third linear guide rail disposed in opposing relation to the first linear guide rail in the state that the first and second linear guide rails opposing each other; a fourth linear guide rail disposed in opposing relation to the second linear guide rail in the state that the first and second linear guide rails opposing each other; a first movable member support for supporting first and third movable member means slidably engaged with the first and the third linear guide rails, respectively, toward one end of one of the first and third linear guide rails and toward the other end of the other of the first and third linear guide rails, respectively, in the state that the first and third linear guide rails are in opposing relation to each other; a second movable member support for supporting second and fourth movable member means slidably engaged with the second and the fourth linear guide rails, respectively, toward one end of one of the second and fourth linear guide rails and toward the other end of the other of the second and fourth linear guide rails, respectively, in the state that the second and fourth linear guide rails are in opposing relation to each other; and biasing means for imparting a biasing force to the movable part, a biasing force to the first movable member support, a biasing force to the second movable member support, and a biasing force to the third and fourth linear guide rails, respectively, so as to hold the first, the second, the third and the fourth linear guide rails in opposing relation to one another.

In a preferred embodiment, the third and fourth linear guide rails are united together or integrated into one piece. The first, second, third and fourth linear guide rails are approximately equal in length, and the biasing means for imparting a biasing force to the movable part, the biasing means for imparting a biasing force to the first movable member support, the biasing means for imparting a biasing force to the second movable member support, and the biasing means for imparting a biasing force to the integrated third and fourth linear guide rails have biasing forces determined such that movement of the movable part by a predetermined distance will cause each of the first and the second movable member supports and the third and the fourth linear guide rails to move by approximately ¼ of the distance of movement of the movable part.

The biasing means for imparting a biasing force to the movable part, the biasing means for imparting a biasing force to the first movable member support, the biasing means for imparting a biasing force to the second movable member support, and the biasing means for imparting a biasing force to the integrated third and fourth linear guide rails are each a tension coil spring, and the tensioning forces of the tension coil springs are determined such that when the movable part is moved by a predetermined distance, those tension coil springs are extended by an approximately equal length with one another.

If desired, an even number of additional linear guide rails may be disposed between the third and the fourth linear guide rails. Each pair of adjacent linear guide rails may be integrated together, and biasing means for imparting a biasing force to each pair of the integrated linear guide rails may be provided.

According to a third aspect of the present invention, the foregoing objects are accomplished by providing a semiconductor device transporting and handling apparatus including a test section disposed in a constant temperature chamber for testing a semiconductor device under test applied with a predetermined temperature stress and a transport means for grasping a semiconductor device under test applied with a predetermined temperature stress and transporting it to the test section in the constant temperature chamber, the semiconductor device transporting and handling apparatus being adapted to transport semiconductor devices to the test section, followed by transporting the semiconductor devices which have been tested in the test section out of the constant temperature chamber and sorting out the tested semiconductor devices on the basis of the test results, and being characterized by including a linearly moving mechanism which comprises: a first linear guide rail mounted to one side surface of the transport means; a head supporting means having a side surface opposing the side surface of the transport means and a device grasping head adapted to grasp a semiconductor device, and being vertically movable to transport a semiconductor device grasped by the device grasping head to the test section; a second linear guide rail mounted to the side surface of the head supporting means opposing the side surface of the transport means so as to be in opposing relation to the first linear guide rail; first and second movable member means slidably engaged with the first and the second linear guide rails, respectively; a movable member support supporting the first and the second movable member means thereon toward one end of one of the first and second linear guide rails and toward the other end of the other of the rails, respectively, in the state that the first and second linear guide rails are in opposing relation to each other; and biasing means for imparting a biasing force to the head supporting means and a biasing force to said movable member support, respectively, so as to hold the first and second linear guide rails in opposing relation to each other.

In a preferred embodiment, the first and second linear guide rails are approximately equal in length, and the biasing means for imparting a biasing force to the head supporting means and the biasing means for imparting a biasing force to the movable member support have biasing forces determined such that movement of the head supporting means by a predetermined distance will cause the movable member support to move by approximately ½ of the distance of movement of the head supporting means.

The biasing means for imparting a biasing force to the head supporting means and the biasing means for imparting a biasing force to the movable member support may each be a tension coil spring, the tensioning forces of the tension coil springs being determined such that when the head supporting means is moved by a predetermined distance, those tension coil springs are extended by an approximately equal length with one another.

According to a fourth aspect of the present invention, the foregoing objects are accomplished by providing a semiconductor device transporting and handling apparatus including a test section disposed in a constant temperature chamber for testing a semiconductor device under test applied with a predetermined temperature stress and a transport means for grasping a semiconductor device under test applied with a predetermined temperature stress and transporting it to the test section in the constant temperature chamber, the semiconductor device transporting and handling apparatus being adapted to transport semiconductor devices to the test section, followed by transporting the semiconductor devices which have been tested in the test section out of the constant temperature chamber and sorting out the tested semiconductor devices on the basis of the test results, and being characterized by including a linearly moving mechanism which comprises: a first linear guide rail mounted to one side surface of the transport means; a head supporting means having a side surface opposing the side surface of the transport means and a device grasping head adapted to grasp a semiconductor device, and being vertically movable to transport a semiconductor device grasped by the device grasping head to the test section; a second linear guide rail mounted to the side surface of the head supporting means opposing the side surface of the transport means so as to be in opposing relation to the first linear guide rail; a third linear guide rail disposed in opposing relation to the first linear guide rail in the state that the first and second linear guide rails oppose each other; a fourth linear guide rail disposed in opposing relation to the second linear guide rail in the state that the first and second linear guide rails oppose each other; a first movable member support for supporting first and third movable member means slidably engaged with the first and the third linear guide rails, respectively, toward one end of one of the first and third linear guide rails and toward the other end of the other of the first and third linear guide rails, respectively, in the state that the first and third linear guide rails are in opposing relation to each other; a second movable member support for supporting second and fourth movable member means slidably engaged with the second and the fourth linear guide rails, respectively, toward one end of one of the second and fourth linear guide rails and toward the other end of the other of the second and fourth linear guide rails, respectively, in the state that the second and fourth linear guide rails are in opposing relation to each other; and biasing means for imparting a biasing force to the head supporting means, a biasing force to the first movable member support, a biasing force to said second movable member support, and a biasing force to the third and fourth linear guide rails, respectively, so as to hold the first, the second, the third and the fourth linear guide rails in opposing relation to one another.

In a preferred embodiment, the third and fourth linear guide rails are united together or integrated into one piece, and the first, the second, the third and the fourth linear guide rails are approximately equal in length.

In addition, the biasing means for imparting a biasing force to the head supporting means, the biasing means for imparting a biasing force to the first movable member support, the biasing means for imparting a biasing force to the second movable member support, and the biasing means for imparting a biasing force to the united or third and fourth linear guide rails have biasing forces determined such that movement of the head supporting means by a predetermined distance will cause each of the first and the second movable member supports and the third and the fourth linear guide rails to move by approximately ¼ of the distance of movement of the head supporting means.

The biasing means for imparting a biasing force to the head supporting means, the biasing means for imparting a biasing force to the first movable member support, the biasing means for imparting a biasing force to the second movable member support, and the biasing means for imparting a biasing force to the united or integrated third and fourth linear guide rails are each a tension coil spring, the tensioning forces of the tension coil springs are determined such that when the head supporting means is moved by a predetermined distance, those tension coil springs are extended by an approximately equal length with one another.

If desired, an even number of additional linear guide rails may be disposed between the third and the fourth linear guide rails. Each pair of adjacent linear guide rails may be united or integrated together, and biasing means for imparting a biasing force to each pair of the integrated linear guide rails may be provided.

In a particular embodiment, the aforesaid transport means comprises a rotary contact arm having its rotary shaft rotatably mounted in the thermally insulating top wall of the constant temperature chamber and having three arms extending generally horizontally and radially from the lower end of the rotary shaft at angular intervals of about 120°, each of the arms having a generally horizontally extending main arm portion and a vertical leg portion depending at a substantially right angle from the main arm portion, the aforesaid first linear guide rail extending vertically along and attached to the outer wall surface of the depending leg portion from the upper to lower portions thereof.

The aforesaid head supporting means has the aforesaid device grasping head on the tip end thereof, and a push rod mounted vertically movably in the thermally insulating top wall of the constant temperature chamber is adapted to transport a semiconductor device grasped by the device grasping head to the test section as the push rod is moved downwardly by a predetermined stroke.

As will be appreciated from the foregoing, the linearly moving mechanism according to the present invention provides for shortening the length of the linear guide rails mounted to the fixed part and the movable part, respectively, and correspondingly reducing the height dimension (the spacing between the top wall and the bottom wall) of the constant temperature chamber. It thus results in the advantage of downsizing the constant temperature chamber.

DETAILED DESCRIPTION OF THE PREFERRED EMBODIMENTS

Figure 1:
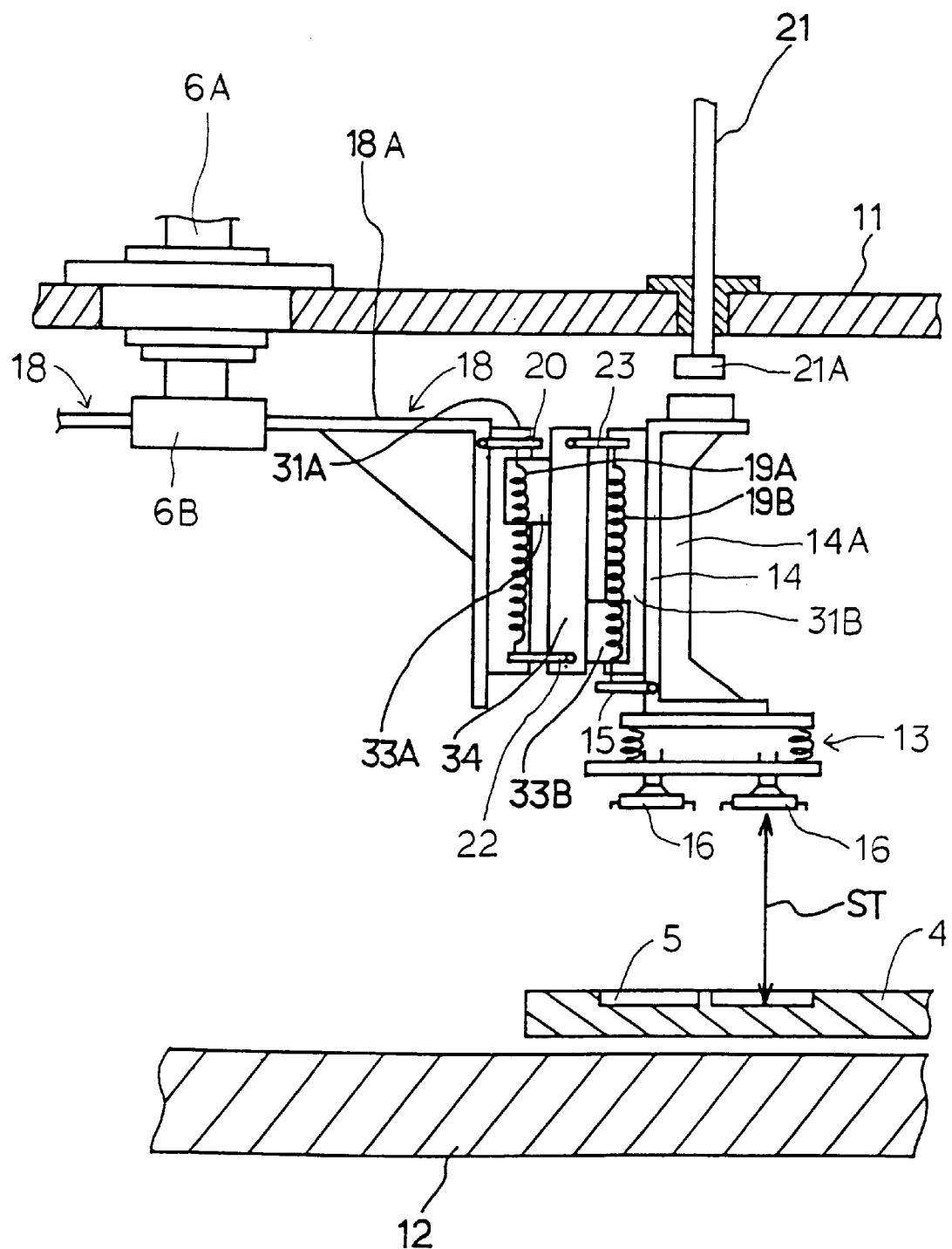
FIG. 1 is a side view, partly in cross-section, showing a first embodiment of the linearly moving mechanism according to the present invention.
Figure 2:
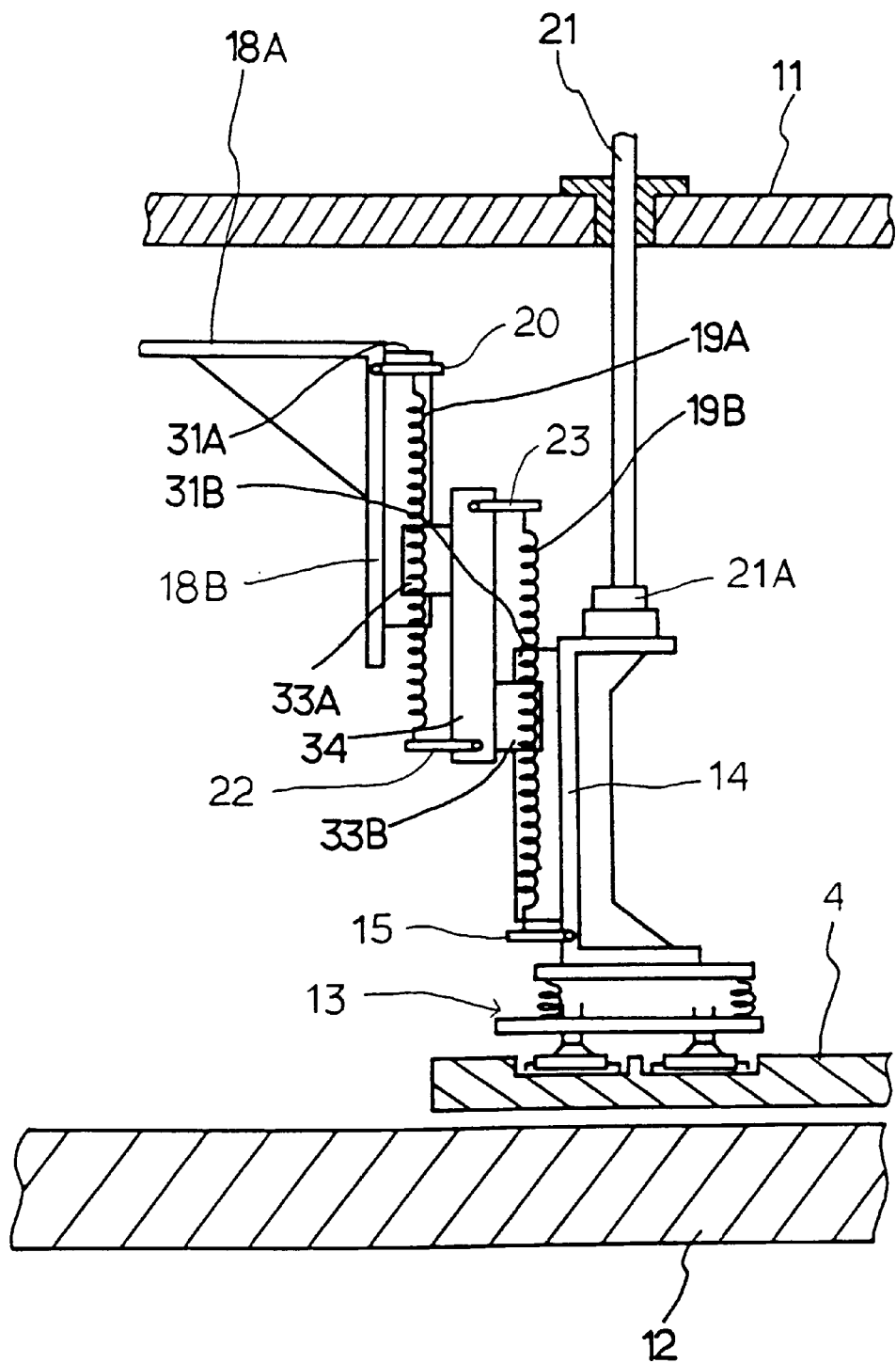
FIG. 2 is a side view, partly in cross-section, illustrating the operation of the linearly moving mechanism shown in FIG. 1.
Figure 4:
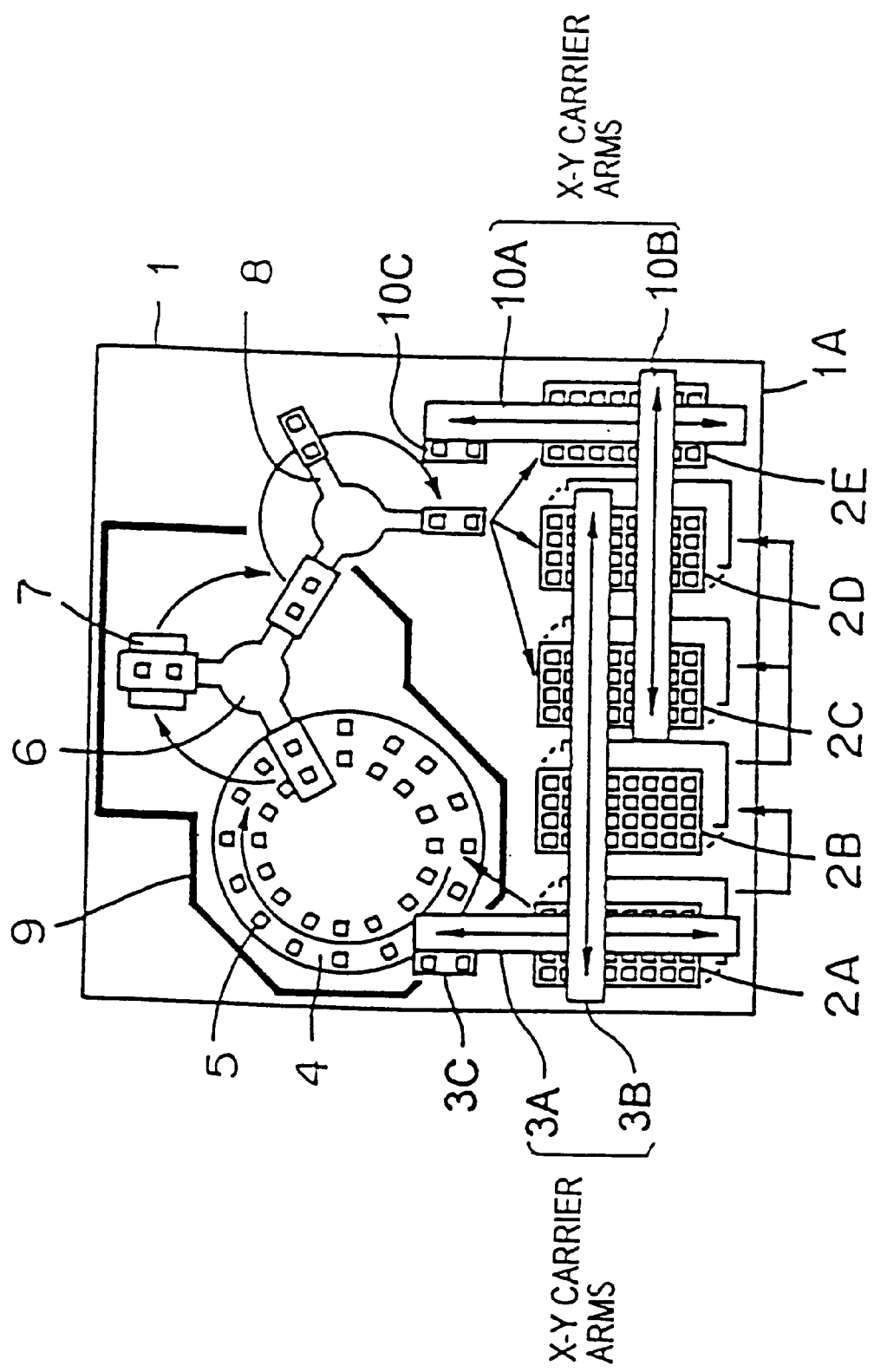
FIG. 4 is a plan view showing the general configuration of one example of the conventional handler.
Figure 5:
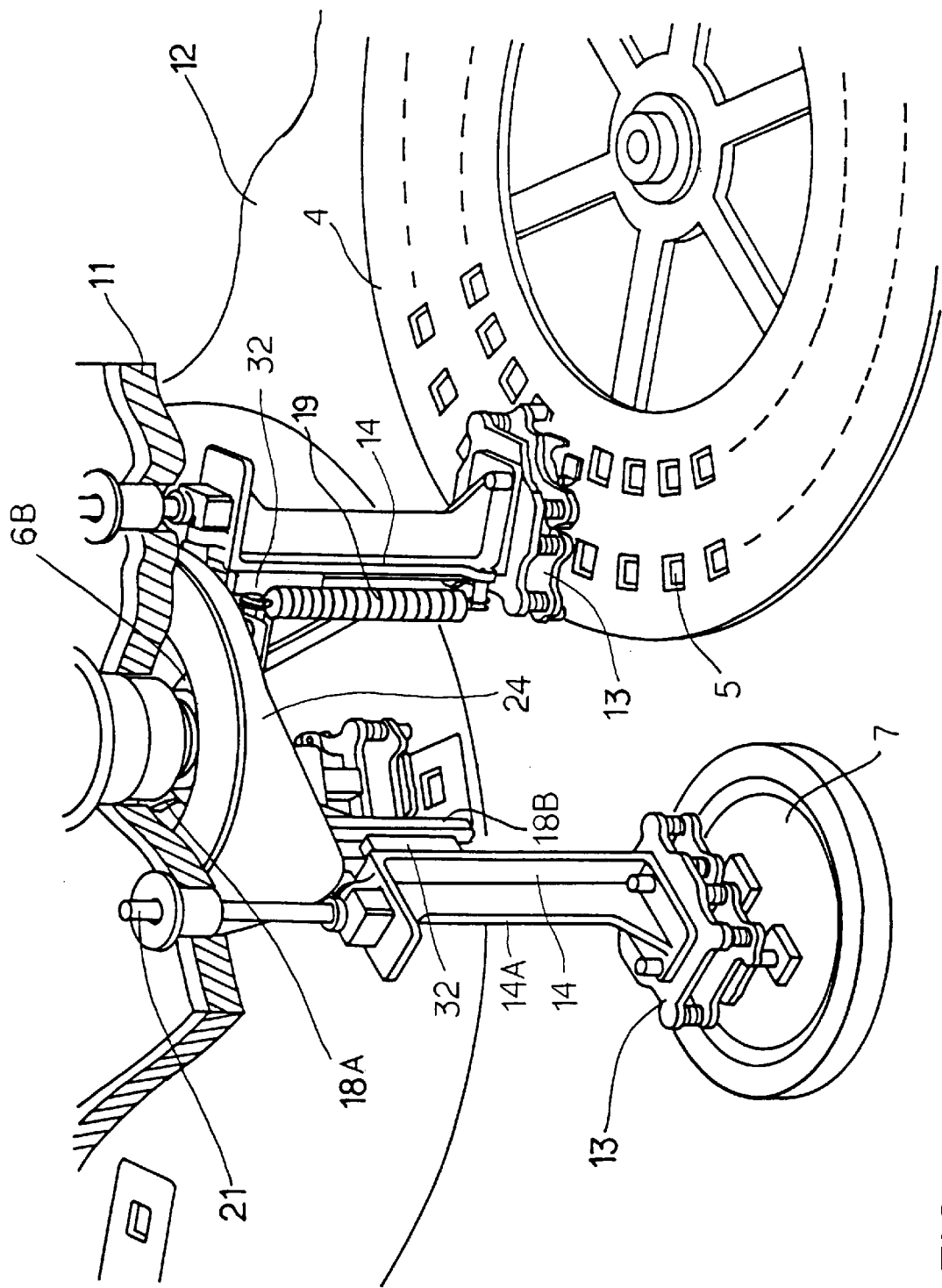
FIG. 5 is a perspective View showing principally the linearly moving mechanism used with the handler shown in FIG. 4.
Figure 6:
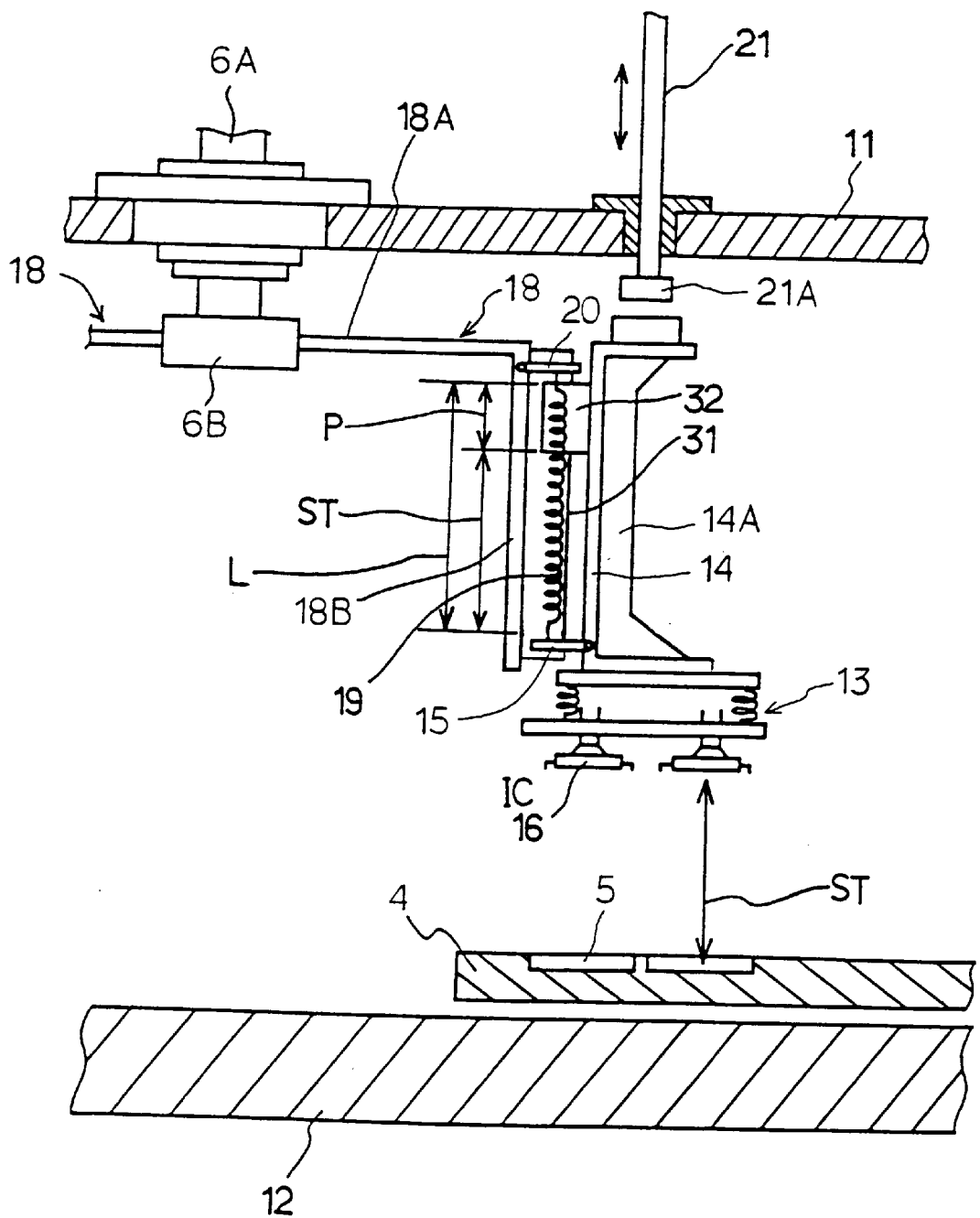
FIG. 6 is a side view illustrating principally the linearly moving mechanism used with the handler shown in FIG. 4.
Figure 7:
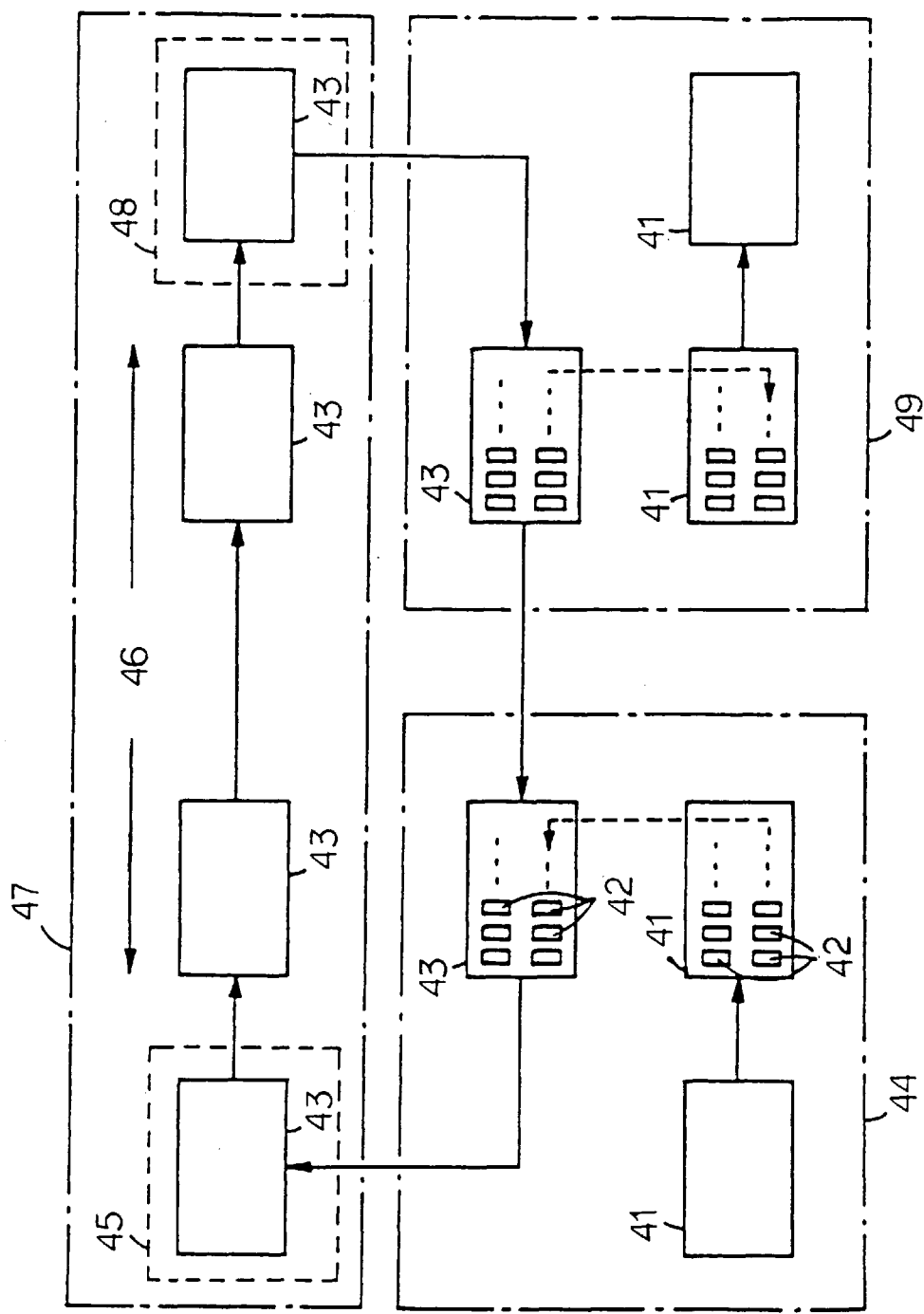
FIG. 7 is an illustration of the general arrangement of another example of the conventional handler.

FIG. 1 is a side view representation of a first embodiment of the linearly moving mechanism according to the present invention illustrating an application where the invention is applied to the linearly moving mechanism for the handler as described above with reference to FIGS. 4–6. FIG. 2 is a side view illustrating the operation of the linearly moving mechanism shown in FIG. 1. In FIGS. 1 and 2, the parts and elements corresponding to those shown in FIGS. 4–6 are designated by the same reference numerals and will not be discussed again in details, unless required.

In the first embodiment, a first linear guide rail 31A is attached to the outer wall of the depending leg portion 18B of each arm 18 which constitutes a fixed part so as to extend vertically along the length of the depending leg portion 18B from the upper portion to the lower portion thereof.

Similarly, a second linear guide rail 31B is attached to the vertical wall of each head supporting member 14 opposing the depending leg portion 18B so as to extend vertically along the length of the wall from the upper portion to the lower portion thereof. A movable member support 34 is disposed longitudinally between the opposed first and second linear guide rails 31A and 31B. The movable member support 34 is mounted for vertical motions and has a pair of movable members 33A affixed to the side surface of the support 34 adjacent the upper end thereof which opposes the first linear guide rail 31A, and another pair of movable members 33B affixed to the side surface of the support adjacent the lower end thereof which opposes the second linear guide rail 31B. The movable members 33A and 33B are engaged with the linear guide rails 31A and 31B, respectively, for sliding movement vertically therealong.

In addition, a first tension coil spring 19A extends vertically between and are connected at opposite ends with an arm member 20 affixed to the depending leg portion 18B of each arm 18 adjacent its upper end and an arm member 22 affixed to the associated movable member support 34 adjacent its lower end. Likewise, a second tension coil spring 19B extends vertically between and are connected at opposite ends with an arm member 23 affixed to each movable member support 34 adjacent its upper end and an arm member 15 affixed to the associated head supporting member 14 adjacent its lower end. The first tension coil spring 19A having its one end secured to the arm member 20 of the depending leg portion 18B has a tensioning force sufficient to hold the associated movable member support 34 at a predetermined elevation (upper dead point shown in FIG. 1) along the outer wall of the depending leg portion 18B so that the movable member support 34 is normally upwardly biased by the tension of the first tension coil spring 19A to be kept stationary at the upper dead point. Similarly, the second tension coil spring 19B having its one end secured to the arm member 23 of the associated movable member support 34B has a tensioning force sufficient to hold the associated head supporting member 14 at a predetermined elevation (upper dead point shown in FIG. 1) along the outer wall of the depending leg portion 18B so that the head supporting member 14 having a transport head 13 mounted thereto is normally upwardly biased by the tension of the second tension coil spring 19B to be kept stationary at the upper dead point.

In the illustrated embodiment, the first and second linear guide rails 31A and 31B are of substantially equal length, and the length of the movable member support 34 is also made substantially equal to that of the linear guide rails. The first and second linear guide rails 31A and 31B connected to the depending leg portion 18B of the arm 18 and the supporting member 14, respectively are configured such that the two guide rails are in opposed position with their upper ends and lower ends flush with each other at the same elevations when the movable member support 34 is biased by the first tension coil spring 19A to be kept stationary at the upper dead point and the head supporting member 14 is biased by the second tension coil spring 19B to be kept stationary at the upper dead point. In this state, the movable members 33A in engagement with the first linear guide rail 31A are positioned toward the upper end of the opposing first linear guide rail 31A while the movable members 33B in engagement with the second linear guide rail 31B are positioned toward the lower end of the opposing second linear guide rail 31B.

With the construction as described above, one arm 18 of the contact arm 6 is rotated to and stopped at a position over the IC transport 4 as shown in FIG. 1, followed by the associated push rod 21 being lowered through a predetermined stroke by the drive means, whereupon the lower end 21A of the push rod 21 comes into abutment against the top of the head supporting member 14 before pushing down on the head supporting member 14. Consequently, the head supporting member 14 is moved downwardly through a predetermined stroke ST against the tensioning force of the second tension coil spring 19B. It is thus to be appreciated that when the push rod 21 is lowered by a predetermined stroke, the vacuum pick-up heads of the transport head 13 come into contact with the ICs under test placed in the positioning recesses 5 of the IC transport 4.

As the head supporting member 14 is moved downwardly through a predetermined stroke ST against the tensioning force of the second tension coil spring 19B, the second tension coil spring 19B is tensioned with its tensioning force increasing, with the result that the movable member support 34 is moved downwardly against the tensioning force of the first tension coil spring 19A until the tensioning forces of the first tension coil spring 19A and the second tension coil spring 19B are equalized whereupon the downward movement of the movable member support 34 is terminated. FIG. 2 shows this condition.

As will be appreciated from FIG. 2, the head supporting member 14 and the transport head 13 which constitute a movable part are moved downwardly by a distance corresponding to the sum of the amounts of extension of the two tension coil spring 19A and 19B while the movable member support 34 is moved downwardly by a distance corresponding to the amount of extension of the first tension coil spring 19A. Accordingly, it will be appreciated that if the tensioning forces of the first and second tension coil springs 19A and 19B are determined such that the sum of the amounts of extension of the tension coil springs 19A and 19B are substantially equal to the predetermined downward stroke ST of the head supporting member 14, the downward movement of the head supporting member 14 through the predetermined downward stroke ST against the tensioning force of the second tension coil spring 19B will cause the downward movement of the movable member support 34 by half (½) the stroke ST against the tensioning force of the first tension coil spring 19A.

As is apparent from FIG. 6, the stroke ST is much longer than the length P of either the movable members 33A or the movable members 33B. Since both the movable members 33A and the movable members 33B need only be moved by approximately half the stroke ST of the head supporting member 14, it is only required that the length of the associated first linear guide rail 31A and second linear guide rail 31B be P+½(ST). In other words, the effective length L of the linear guide rail 31A or 31B actually required to allow the movable members 33A or 33B to slide therealong is the aforesaid length {P+½(ST)} representing the length P of the movable members 33A or 33B plus half the length of stroke ST actually required of the transport head 13.

It is thus to be appreciated that even if some extra length of the rails were provided beyond the upper and lower limits of movement of the movable members 33A and 33B for the sake of safety, the first and second linear guide rails 31A, 31B would be still far shorter than the length of stroke ST. This provides for reducing both the length of the depending leg portion 18B of each arm 18 and the length of the head supporting member 14. Consequently, it is possible to substantially shorten the spacing (distance) between the top wall 11 and the bottom wall 12 of the constant temperature chamber 9 as compared to the prior art, leading to downsizing the constant temperature chamber 9 and hence the entire handler.

Figure 3:
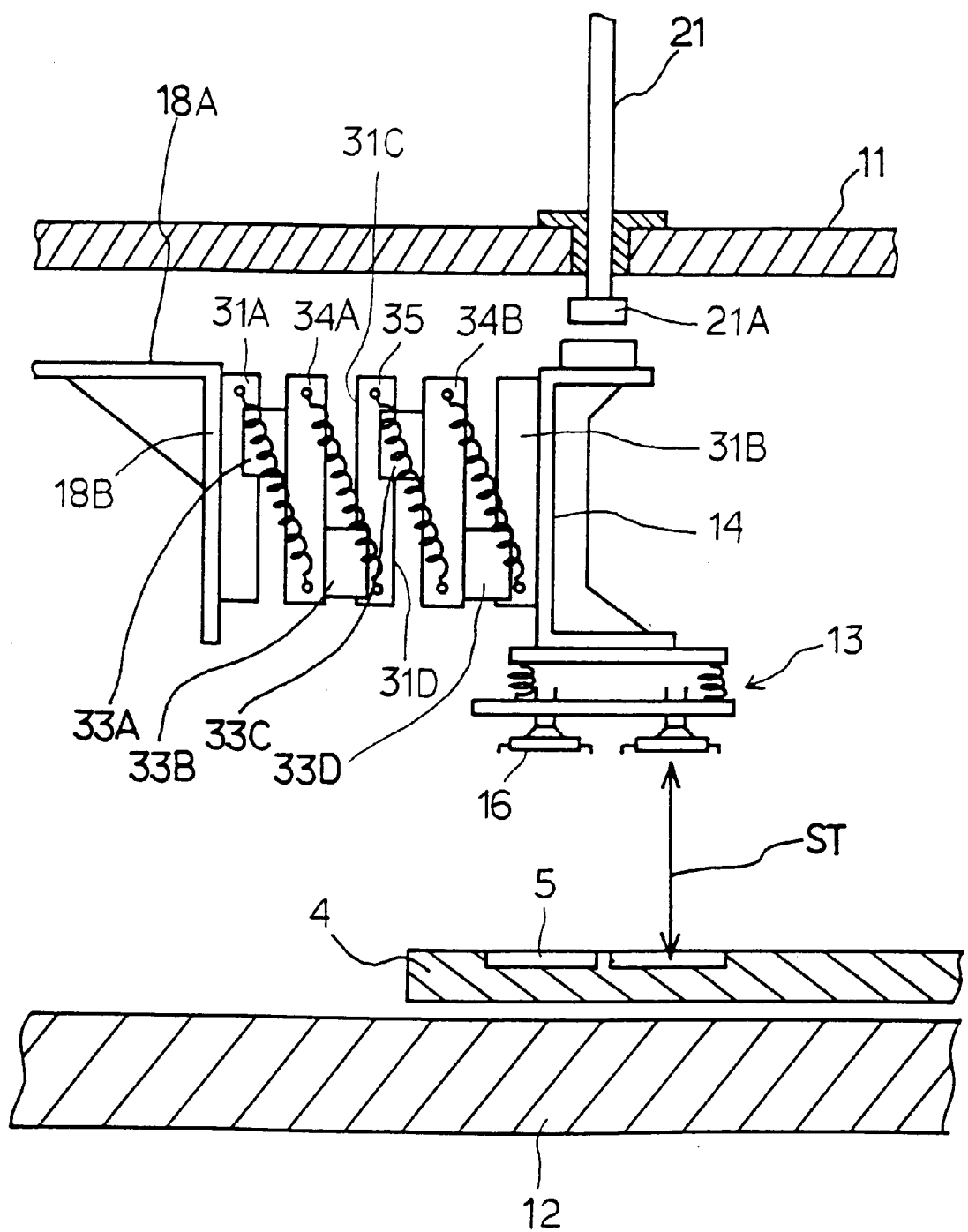
FIG. 3 is a side view, partly in cross-section, showing a second embodiment of the linearly moving mechanism according to the present invention.

FIG. 3 is a side view representation of a second embodiment of the linearly moving mechanism according to the present invention again illustrating an application where the invention is applied to the linearly moving mechanism for the handler as described above with reference to FIGS. 4–6. Accordingly, in FIG. 3, the parts and elements corresponding to those shown in FIG. 1 and FIGS. 4–6 are designated by the same reference numerals and will not be discussed again in details, unless required.

In this second embodiment, first and second movable member supports 34A and 34B similar in configuration to the movable member support 34 used in the first embodiment are provided, and in addition, a guide rail support 35 is disposed longitudinally between the opposed first and second movable member supports 34A and 34B. The guide rail support 35 is mounted for vertical motions and has affixed to the opposite side surfaces thereof third and fourth linear guide rails 31C and 31D extending vertically along the side surfaces from the upper end to the lower end thereof. The assembly including the guide rail support 35 mounted between the two movable member supports 34A and 34B is disposed between the outer wall of the depending leg portion 18B of each arm 18 which constitutes a fixed part and the vertical wall of and the head supporting member 14 which constitutes a movable part. It should be noted that the first and second movable member supports 34A and 34B are also mounted for vertical motions.

Like the first embodiment, a first linear guide rail 31A is attached to the outer wall of the depending leg portion 18B of each arm 18 which constitutes a fixed part so as to extend vertically along the length of the depending leg portion 18B from the upper end to the lower end thereof and a second linear guide rail 31B is attached to the vertical wall of each head supporting member 14 opposing the depending leg portion 18B so as to extend vertically along the length of the wall from the upper end to the lower end thereof.

A pair of movable members 33A are affixed to the side surface of the first movable member support 34A adjacent the upper end thereof which opposes the first linear guide rail 31A. The movable members 33A are engaged with the first linear guide rail 31A of the depending leg portion 18B for sliding movement vertically therealong. Another pair of movable members 33B are affixed to the side surface of the first movable member support 34A adjacent the lower end thereof which opposes the third linear guide rail 31C.

The movable members 33B are engaged with the third linear guide rail 31C of the guide rail support 35 for sliding movement vertically therealong. Still another pair of movable members 33C are affixed to the side surface of the second movable member support 34B adjacent the upper end thereof which opposes the fourth linear guide rail 31D. The movable members 33C are engaged with the fourth linear guide rail 31D of the guide rail support 35 for sliding movement vertically therealong. Yet another pair of movable members 33D are affixed to the side surface of the head supporting member 14 adjacent the lower end thereof which opposes the second linear guide rail 31B. The movable members 33D are engaged with the second linear guide rail 31B of the head supporting member 14 for sliding movement vertically therealong.

In addition, first, second, third and fourth tension coil springs 19A, 19B, 19C and 19D, respectively extend vertically between the depending leg portion 18B of each arm 18 adjacent its upper end and the associated first movable member support 34A adjacent its lower end thereof, between each first movable member support 34A and the associated guide rail support 35 adjacent its lower end, between each guide rail support 35 and the associated second movable member support 34B adjacent its lower end, and between each second movable member support 34B adjacent its upper end and the associated head supporting member 14 adjacent its lower end, respectively.

The first tension coil spring 19A having its one end secured to each depending leg portion 18B adjacent the upper end thereof has a tensioning force sufficient to hold the associated movable member support 34A at a predetermined elevation (upper dead point shown in FIG. 3) along the outer wall of the depending leg portion 18B so that the movable member support 34A is normally upwardly biased by the tension of the first tension coil spring 19A to be kept stationary at the upper dead point. Similarly, the second tension coil spring 19B having its one end secured to each first movable member support 34A has a tensioning force sufficient to hold the associated guide rail support 35 at a predetermined elevation (upper dead point shown in FIG. 3) along the outer wall of the depending leg portion 18B so that the guide rail support 35 mounted thereto is normally upwardly biased by the tension of the second tension coil spring 19B to be kept stationary at the upper dead point. Further, the third tension coil spring 19C having its one end secured to each guide rail support 35 adjacent the upper end thereof has a tensioning force sufficient to hold the associated second movable member support 34B at a predetermined elevation (upper dead point shown in FIG. 3) along the outer wall of the depending leg portion 18B so that the second movable member support 34B is normally upwardly biased by the tension of the third tension coil spring 19C to be kept stationary at the upper dead point. The fourth tension coil spring 19D having its one end secured to each second movable member support 34B has a tensioning force sufficient to hold the associated head supporting member 14 at a predetermined elevation (upper dead point shown in FIG. 1) along the outer wall of the depending leg portion 18B so that the head supporting member 14 and the transport head 13 mounted thereto are normally upwardly biased by the tension of the fourth tension coil spring 19D to be kept stationary at the upper dead point.

In this embodiment, the first to fourth linear guide rails 31A–31D are all of substantially equal length, and the length of the first and second movable member supports 34A and 34B and the length of the guide rail support 35 are also made substantially equal to that of the linear guide rails. The first and second linear guide rails 31A and 31B connected to the depending leg portion 18B of the arm 18 and the supporting member 14, respectively are configured such that the two guide rails are in opposed position with their upper ends and lower ends flush with each other at the same elevations when the first movable member support 34A is biased by the first tension coil spring 19A to be kept stationary at the upper dead point and the second movable member support 34B, the guide rail support 35 and the head supporting member 14 are biased by the second, third and fourth tension coil springs 19B, 19C and 19D, respectively to their upper dead points. In this position, the movable members 33A in engagement with the first linear guide rail 31A and the movable members 33C in engagement with the fourth linear guide rail 31D are positioned toward the upper ends of the opposing first linear guide rail 31A while are positioned toward the lower end of the opposing linear guide rails 31A and 31D, respectively while the movable members 33B in engagement with the third linear guide rail 31C and the movable members 33D in engagement with the second linear guide rail 31B are positioned toward the lower ends of the opposing linear guide rails 31C and 31B, respectively.

With the construction as described above, when the push rod 21 is lowered through a predetermined stroke by the associated drive means, the lower end 21A of the push rod 21 comes into abutment against the top of the head supporting member 14 before pushing down on the head supporting member 14. Consequently, the head supporting member 14 is moved downwardly through a predetermined stroke ST against the tensioning force of the fourth tension coil spring 19D. Thus, the downward movement of the push rod 21 by a predetermined stroke brings the vacuum pick-up heads attached to the lower end of the transport head 13 into contact with the ICs under test placed in the positioning recesses 5 of the IC transport 4.

As the head supporting member 14 is moved downwardly through a predetermined stroke ST against the tensioning force of the fourth tension coil spring 19D, the fourth tension coil spring 19D is tensioned with its tensioning force increasing, with the result that the second movable member support 34B is moved downwardly against the tensioning force of the third tension coil spring 19C whereby the guide rail support 35 is moved downwardly against the tensioning force of the second tension coil spring 19B, followed by the first movable member support 34A being moved downwardly against the tensioning force of the first tension coil spring 19A. The downward movement of the first and second movable member support 34A and 34B, and the guide rail support 35 are terminated when the tensioning forces of the four tension coil springs 19A–19D are brought into equilibrium.

The head supporting member 14 and the transport head 13 which constitute a movable part are moved downwardly by a distance corresponding to the sum of the amounts of extension of the four tension coil spring 19A–19D; the second movable member support 34B is moved downwardly by a distance corresponding to the amount of extension of the first, second and third tension coil springs 19A, 19B and 19C; the guide rail support 35 is moved downwardly by a distance corresponding to the sum of the amounts of extension of the first and second tension coil springs 19A and 19B; and the first movable member support 34A is moved downwardly by a distance corresponding to the amount of extension of the first tension coil springs 19A. Accordingly, it will be appreciated that if the tensioning forces of the tension coil springs 19A–19D are determined such that the sum of the amounts of extension of these tension coil springs is substantially equal to the predetermined downward stroke ST of the head supporting member 14, the downward movement of the head supporting member 14 through the predetermined downward stroke ST against the tensioning force of the fourth tension coil spring 19D will cause the downward movement of each of the first and second movable member supports 34A and 34B by one-fourth (¼) of the stroke ST against the tensioning force of the associated coil spring.

As is apparent from the foregoing, since any of the movable members 33A–33D need only be moved by approximately one-fourth (¼) of the stroke ST of the head supporting member 14, it is only required that the length of each of the associated linear guide rails 31A–31D be P+¼(ST). In this regard, the effective length L of the linear guide rails actually required to allow the movable members 33A or 33B to slide therealong is the aforesaid length {P+¼(ST)} representing the length P of the movable members plus one-fourth (¼) of the length of stroke ST actually required of the transport head 13.

Consequently, even if some extra length of the rails were provided beyond the upper and lower limits of movement of the movable members for the sake of safety, the first through fourth linear guide rails 31A–31D would be still shorter than in the first embodiment. This results in reducing both the length of the depending leg portion 18B of each arm 18 and that of the head supporting member 14 further than the first embodiment can, contributing to further shortening the spacing (distance) between the top wall 11 and the bottom wall 12 of the constant temperature chamber 9 as compared to the prior art, leading to downsizing the entire constant temperature chamber 9.

While an increase in the number of the guide rail supports 35 with a corresponding increase in the number of the movable member supports will allow for further shortening the length of the linear guide rails, it will be understood that the number of the guide rail supports 35 is naturally limited by the correspondingly increased transverse (left-to-right as viewed in the drawing) dimension of the chamber.

While the embodiments described herein represent the application where the invention is applied to the linearly moving mechanism for use with the handler described with reference to FIGS. 4–6, it will be appreciated that the present invention is also applicable, with the essentially equal functional advantages, to any other handler which employs a linearly moving mechanism of construction similar to that discussed herein.

It should also be noted that the head supporting member 14 and the transport head 13 which constitute a movable part may be provided with biasing means other than coil springs so as to be biased to a predetermined elevation along the outer wall of the depending leg portion 18B of each arm 18 which constitutes a fixed part. It is needless to say that the movable member supports 34, 34A, 34B or guide rail support 35 may likewise be provided with biasing means other than coil springs so as to be biased toward a desired position.

As is appreciated from the foregoing discussion, the present invention, provides for reducing the length of the linear guide rail means to one-half (½) or less (½, ¼, 1/N where N is an even number) of the stroke ST of the movable component required to move along the linear guide rail means for moving an article in a straight line. As a result, if the present invention is applied to the handler of an IC testing apparatus, for example, the length of the linear guide rail means installed in the interior of the constant temperature chamber may be shortened, and hence the height dimension of the constant temperature chamber may correspondingly be reduced. It thus results in downsizing the constant temperature chamber, leading ultimately to the advantage of reducing the size of the entire IC testing apparatus. Moreover, the present invention provides the marked advantage in terms of economy as well that the downsizing of the constant temperature chamber may also reduce the consumption of electrical energy or the usage of refrigerant required to maintain the constant temperature chamber at a predetermined temperature.

What is claimed is:

1. A linearly moving mechanism including a fixed part and a movable part having side surfaces opposing each other, said movable part being adapted to reciprocally move along a straight line relative to said fixed part, said linearly moving mechanism comprising:

a first linear guide rail mounted to the side surface of said fixed part opposing said movable part;

a second linear guide rail mounted to the side surface of said movable part opposing said fixed part so as to be in opposing relation to said first linear guide rail;

first and second movable member means slidably engaged with said first and said second linear guide rails, respectively;

a movable member support supporting said first and said second movable member means thereon toward one end of one of said first and second linear guide rails and toward the other end of the other of said rails, respectively, in the state that said first and second linear guide rails are in opposing relation to each other; and biasing means for imparting a biasing force to said movable part and a biasing force to said movable member support, respectively, so as to hold said first and second linear guide rails in opposing relation to each other.

2. The linearly moving mechanism according to claim 1, wherein said first and second linear guide rails are of approximately equal length, and said biasing means for imparting a biasing force to said movable part and said biasing means for imparting a biasing force to said movable member support have biasing forces determined such that movement of said movable part by a predetermined distance will cause said movable member support to move by approximately ½ of the distance of movement of said movable part.

3. The linearly moving mechanism according to claim 1, wherein said biasing means for imparting a biasing force to said movable part and said biasing means for imparting a biasing force to said movable member support are each a tension coil spring, and the tensioning forces of said tension coil springs are determined such that when said movable part is moved by a predetermined distance, those tension coil springs are extended by an approximately equal length with each other.

4. A linearly moving mechanism including a fixed part and a movable part having side surfaces opposing each other, said movable part being adapted to reciprocally move along a straight line relative to said fixed part, said linearly moving mechanism comprising:

a first linear guide rail mounted to the side surface of said fixed part opposing said movable part;

a second linear guide rail mounted to the side surface of said movable part opposing said fixed part so as to be in opposing relation to said first linear guide rail;

a third linear guide rail disposed in opposing relation to said first linear guide rail in the state that said first and second linear guide rails oppose each other;

a fourth linear guide rail disposed in opposing relation to said second linear guide rail in the state that said first and second linear guide rails oppose each other;

a first movable member support for supporting first and third movable member means slidably engaged with said first and said third linear guide rails, respectively, toward one end of one of said first and third linear guide rails and toward the other end of the other of said first and third linear guide rails, respectively, in the state that said first and third linear guide rails are in opposing relation to each other;

a second movable member support for supporting second and fourth movable member means slidably engaged with said second and said fourth linear guide rails, respectively, toward one end of one of said second and fourth linear guide rails and toward the other end of the other of said second and fourth linear guide rails, respectively, in the state that said second and fourth linear guide rails are in opposing relation to each other; and biasing means for imparting a biasing force to said movable part, a biasing force to said first movable member support, a biasing force to said second movable member support, and a biasing force to said third and fourth linear guide rails, respectively, so as to hold said first, said second, said third and said fourth linear guide rails in opposing relation to one another.

5. The linearly moving mechanism according to claim 4, wherein said third and fourth linear guide rails are integrated into one piece.

6. The linearly moving mechanism according to claim 5, wherein said first, second, third and fourth linear guide rails are of approximately equal length, and said biasing means for imparting a biasing force to said movable part, said biasing means for imparting a biasing forces to said first movable member support, said biasing means for imparting a biasing force to said second movable member support, and said biasing means for imparting a biasing force to said integrated third and fourth linear guide rails have biasing forces determined such that movement of said movable part by a predetermined distance will cause each of said first and second movable member supports and said third and fourth linear guide rails to move by approximately ¼ of the distance of movement of said movable part.

7. The linearly moving mechanism according to claim 5, wherein said biasing means for imparting a biasing force to said movable part, said biasing means for imparting a biasing forces to said first movable member support, said biasing means for imparting a biasing force to said second movable member support, and said biasing means for imparting a biasing force to said integrated third and fourth linear guide rails are each a tension coil spring, and the tensioning forces of the tension coil springs are determined such that when said movable part is moved by a predetermined distance, those tension coil springs are extended by an approximately equal length with one another.

8. The linearly moving mechanism according to claim 5, wherein an even number of additional linear guide rails are disposed between said third and fourth linear guide rails.

9. A semiconductor device transporting and handling apparatus including a test section disposed in a constant temperature chamber for testing a semiconductor device under test applied with a predetermined temperature stress and a transport means for grasping a semiconductor device under test applied with a predetermined temperature stress and transporting it to said test section in said constant temperature chamber, said semiconductor device transporting and handling apparatus being adapted to transport semiconductor devices to said test section, followed by transporting the semiconductor devices which have been tested in the test section out of the constant temperature chamber and sorting out the tested semiconductor devices on the basis of the test results, and being characterized by including a linearly moving mechanism which comprises:

a first linear guide rail mounted to one side surface of said transport means;

a head supporting means having a side surface opposing said side surface of said transport means and a device grasping head adapted to grasp a semiconductor device, and being vertically movable to transport a semiconductor device grasped by said device grasping head to said test section;

a second linear guide rail mounted to the side surface of said head supporting means opposing said side surface of said transport means so as to be in opposing relation to said first linear guide rail;

first and second movable member means slidably engaged with said first and said second linear guide rails, respectively;

a movable member support supporting said first and said second movable member means thereon toward one end of one of said first and second linear guide rails and toward the other end of the other of said rails, respectively, in the state that said first and second linear guide rails are in opposing relation to each other; and biasing means for imparting a biasing force to said head supporting means and a biasing force to said movable member support, respectively, so as to hold said first and second linear guide rails in opposing relation to each other.

10. The semiconductor device transporting and handling apparatus according to claim 9, wherein said first and second linear guide rails are of approximately equal length, and said biasing means for imparting a biasing force to said head supporting means and said biasing means for imparting a biasing force to said movable member support have biasing forces determined such that movement of said head supporting means by a predetermined distance will cause said movable member support to move by approximately ½ of the distance of movement of said head supporting means.

11. The semiconductor device transporting and handling apparatus according to claim 9, wherein said biasing means for imparting a biasing force to said head supporting means and said biasing means for imparting a biasing force to said movable member support are each a tension coil spring, and the tensioning forces of the tension coil springs are determined such that when said head supporting means is moved by a predetermined distance, those tension coil springs are extended by an approximately equal length with each other.

12. A semiconductor device transporting and handling apparatus including a test section disposed in a constant temperature chamber for testing a semiconductor device under test applied with a predetermined temperature stress and a transport means for grasping a semiconductor device under test applied with a predetermined temperature stress and transporting it to said test section in said constant temperature chamber, said semiconductor device transporting and handling apparatus being adapted to transport semiconductor devices to said test section, followed by transporting the semiconductor devices which have been tested in the test section out of the constant temperature chamber and sorting out the tested semiconductor devices on the basis of the test results, and being characterized by including a linearly moving mechanism which comprises:

a first linear guide rail mounted to one side surface of said transport means;

a head supporting means having a side surface opposing said side surface of said transport means and a device grasping head adapted to grasp a semiconductor device, and being vertically movable to transport a semiconductor device grasped by said device grasping head to said test section;

a second linear guide rail mounted to the side surface of said head supporting means opposing said side surface of said transport means so as to be in opposing relation to said first linear guide rail;

a third linear guide rail disposed in opposing relation to said first linear guide rail in the state that said first and second linear guide rails oppose each other;

a fourth linear guide rail disposed in opposing relation to said second linear guide rail in the state that said first and second linear guide rails oppose each other;

a first movable member support for supporting first and third movable member means slidably engaged with said first and said third linear guide rails, respectively, toward one end of one of said first and third linear guide rails and toward the other end of the other of said first and third linear guide rails, respectively, in the state that said first and third linear guide rails are in opposing relation to each other;

a second movable member support for supporting second and fourth movable member means slidably engaged with said second and said fourth linear guide rails, respectively, toward one end of one of said second and fourth linear guide rails and toward the other end of the other of said second and fourth linear guide rails, respectively, in the state that said second and fourth linear guide rails are in opposing relation to each other; and biasing means for imparting a biasing force to said head supporting means, a biasing force to said first movable member support, a biasing force to said second movable member support, and a biasing force to said third and fourth linear guide rails, respectively, so as to hold said first, said second, said third and said fourth linear guide rails in opposing relation to one another.

13. The semiconductor device transporting and handling apparatus according to claim 12, wherein said third and fourth linear guide rails are integrated into one piece.

14. The semiconductor device transporting and handling apparatus according to claim 13, wherein said first, second, third and fourth linear guide rails are of approximately equal length, and said biasing means for imparting a biasing force to said head supporting means, said biasing means for imparting a biasing force to said first movable member support, said biasing means for imparting a biasing forces to said second movable member support, and said biasing means for imparting a biasing force to said integrated third and fourth linear guide rails have biasing forces determined such that movement of said head supporting means by a predetermined distance will cause each of said first and said second movable member supports and said third and said fourth linear guide rails to move by approximately ¼ of the distance of movement of said head supporting means.

15. The semiconductor device transporting and handling apparatus according to claim 13, wherein said biasing means for imparting a biasing force to said head supporting means, said biasing means for imparting a biasing forces to said first movable member support, said biasing means for imparting a biasing force to said second movable member support, and said biasing means for imparting a biasing force to said integrated third and fourth linear guide rails are each a tension coil spring, and the tensioning forces of the tension coil springs are determined such that when said head supporting means is moved by a predetermined distance, those tension coil springs are extended by an approximately equal length with one another.

16. The semiconductor device transporting and handling apparatus according to claim 13, wherein an even number of additional linear guide rails are disposed between said third and said fourth linear guide rails.

17. The semiconductor device transporting and handling apparatus according to any one of claims 9 to 16, wherein said transport means comprises a rotary type transport arm means having its rotary shaft rotatably mounted in the thermally insulating top wall of said constant temperature chamber and having three arms extending generally horizontally and radially from the lower end of said rotary shaft at angular intervals of about 120°, each of said arms having a generally horizontally extending main arm portion and a vertical leg portion depending at a substantially right angle from said main arm portion; and wherein said first linear guide rail extending vertically along and attached to an outer wall surface of said depending leg portion from the upper to lower portions thereof, and said head supporting means have said device grasping head on the tip end thereof;

said semiconductor device transporting and handling apparatus further including a push rod mounted vertically movably in the thermally insulating top wall of said constant temperature chamber, and said push rod being adapted to transport a semiconductor device grasped by said device grasping head to said test section as said push rod is moved downwardly by a predetermined stroke.

* * * * *